United States Patent
Lin

(10) Patent No.: US 7,182,814 B1
(45) Date of Patent: Feb. 27, 2007

(54) SAMPLE HOLDER FOR PHYSICAL VAPOR DEPOSITION EQUIPMENT

(75) Inventor: Te-Kun Lin, Banciao (TW)

(73) Assignee: Hong-Cing Lin, Taipei (TW)

( * ) Notice: Subject to any disclaimer, the term of this patent is extended or adjusted under 35 U.S.C. 154(b) by 0 days.

(21) Appl. No.: 11/202,173

(22) Filed: Aug. 12, 2005

(51) Int. Cl.
*C23C 14/22* (2006.01)
*C23C 14/50* (2006.01)

(52) U.S. Cl. ............... 118/500; 118/730; 118/503; 204/298.15; 204/298.27; 204/298.28

(58) Field of Classification Search ............ 204/298.15, 204/298.27, 298.28; 118/230
See application file for complete search history.

(56) References Cited

FOREIGN PATENT DOCUMENTS

| GB | 2168080 | * | 6/1986 |
| JP | 52-47530 | * | 4/1977 |
| TW | 512181 | | 12/2002 |

* cited by examiner

*Primary Examiner*—Richard Bueker

(57) ABSTRACT

A sample holder for physical vapor deposition equipment, which is disposed in a vacuum chamber for holding samples, includes a transmission mechanism and a fastening mechanism. The transmission mechanism includes a stationary shaft and a transmission element. The fastening mechanism includes a rotation shaft unparalleled with the stationary shaft of the transmission mechanism, a support arm for securely holding the rotation shaft, and a rotational disk assembly that drives the rotation shaft and the support arm to rotate about the transmission mechanism. Two ends of the rotation shaft are connected to a rotation element and an affixation base. The rotation element rotates in response to the transmission element, thereby rendering the affixation base to perform inclined rotation. In this manner, the nanometer ions can be coated continuously and homogeneously onto the sample surface to enhance the surface hardness, the erosion resistance and the life expectancy of the sample.

11 Claims, 4 Drawing Sheets

SAMPLE HOLDER FOR PHYSICAL VAPOR DEPOSITION EQUIPMENT

BACKGROUND OF THE INVENTION

The present invention relates generally to a physical vapor deposition equipment, and more particularly to a sample holder for the physical vapor deposition equipment.

Currently, the physical vapor deposition (PVD) has become a common technology for performing surface processing on ornaments, utensils, knifes, tools, molds and semiconductors. The PVD technology can apply a nanometer ionic coating to the samples, thereby increasing the heat and erosion resistance, the surface hardness, and the life expectancy. However, it important in the art to provide equipment that can continuously and homogeneously coat the nano-meter ions onto the sample surface, so as to extend the mechanical properties and the life expectancy of the sample.

One conventional sample holder for physical vapor deposition equipment is disclosed in Taiwanese patent publication no. 512181, wherein the sample holder includes a stationary shaft and a plurality of rotation shaft parallel and above to the stationary shaft. A conical affixation base is connected to the above of each rotation shaft. The affixation base provides the sample to be disposed thereon. In addition to rotating about the stationary shaft, each affixation base also spins about itself. The sputtered nano-meter ions can then be coated on the sample surface.

However, the conventional sample holder for physical vapor deposition equipment is still problematic in the following aspects. Since the affixation base is vertically rotating, the nano-meter ions are discontinuously coated on the sample. In addition, such physical vapor deposition process is operated under a low vapor temperature, and does not comprise diffusive combination property, thereby rendering inhomogeneous coating thickness and poor combination. Furthermore, for slender or large sized samples, there is shielding effects between the samples. The adhesion of ions is thus inhomogeneous. Moreover, since the nanometer ions are fallen down through a parabolic projectile, the upper portion of the samples will absorb more ions, while the lower portion will absorb only a few ions. The coating thickness of the samples becomes very inhomogeneous. Even further, since the affixation base rotates about the stationary shaft as well as spins about itself, the structure of the sample holder becomes very complicated. One can not effectively lower the production cost of the physical vapor deposition equipment.

Accordingly, the inventor of the present invention realized the drawbacks in the conventional art, and developed the present invention that can overcome the drawbacks described above.

BRIEF SUMMARY OF THE INVENTION

The present invention is to provide a sample holder for physical vapor deposition equipment. Since the stationary shaft and the rotation shaft of the sample holder is unparalleled with each other, and the affixation base can perform inclined rotation, the nano-meter ions can be coated continuously and homogeneously onto the sample surface. Therefore, the surface hardness, the erosion resistance and the life expectancy of the sample is enhanced.

In order to achieve the above and other objectives, the sample holder for physical vapor deposition equipment, which is disposed in a vacuum chamber for holding samples, includes a transmission mechanism and a fastening mechanism. The transmission mechanism includes a stationary shaft and a transmission element connected to the stationary shaft. The fastening mechanism includes a rotation shaft unparalleled with the stationary shaft of the transmission mechanism, a support arm for securely holding the rotation shaft, and a rotational disk assembly that drives the rotation shaft and the support arm to rotate about the transmission mechanism. Two ends of the rotation shaft are connected to a rotation element and an affixation base, wherein the rotation element rotates in response to the transmission element, thereby rendering the affixation base to perform inclined rotation. The objectives described above is thus achieved.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
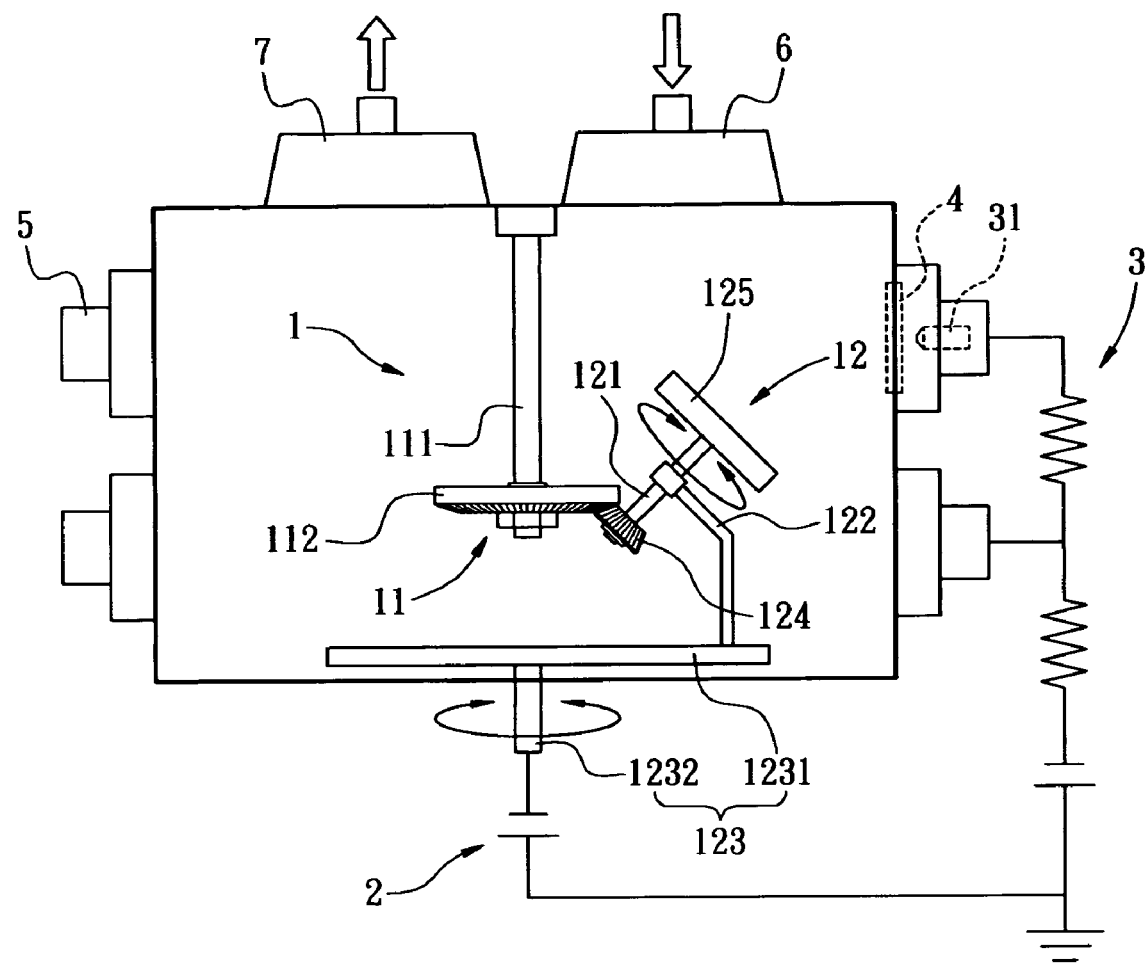
FIG. 1 illustrates a sample holder for physical vapor deposition equipment, in accordance with one embodiment of the present invention.
Figure 2:
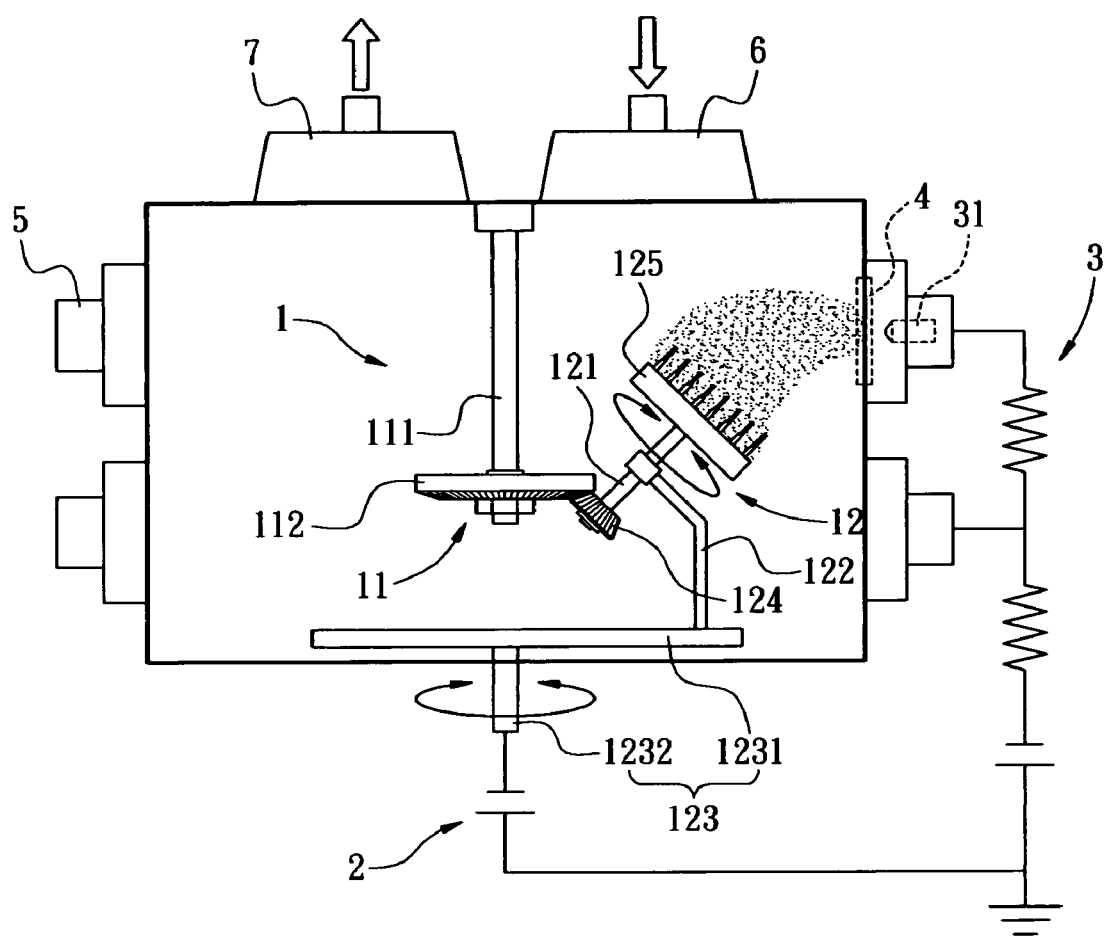
FIG. 2 illustrates the usage of the sample holder for physical vapor deposition equipment, in accordance with one embodiment of the present invention.
Figure 3:
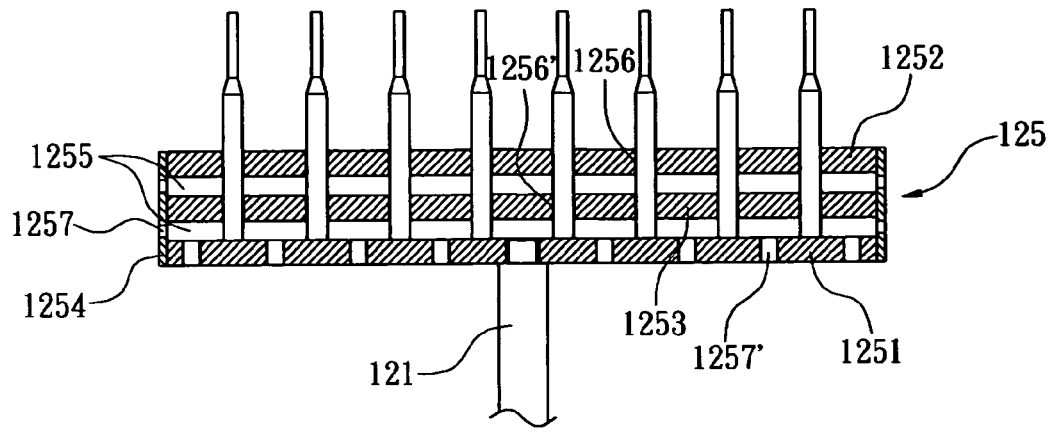
FIG. 3 illustrates the combination of the affixation base and the sample shown in FIG. 2.

Referring to FIG. 1, FIG. 2 and FIG. 3, a sample holder for physical vapor deposition equipment, the usage of the sample holder, and a sectional view illustrating the combination of the affixation base and the sample, in accordance with one embodiment of the present invention, are illustrated respectively. The present invention provides a sample holder for physical vapor deposition equipment. The sample holder 1 is disposed in the PVD chamber for holding samples, which includes a transmission mechanism 11 and at least a fastening mechanism.

The transmission mechanism 11 is fastened to the top surface of the PVD chamber, which includes a stationary shaft 111 and a transmission element 112 connected to the stationary shaft 111. The stationary shaft 111 is vertically disposed, while the transmission element 112 is a bevel gear or a crown gear.

The fastening mechanism 12 includes a rotation shaft 121 unparalleled with the fastening shaft 111 of the transmission mechanism 11, a support arm 122 for supporting the rotation shaft 121, and a rotational disk assembly 123 that drives the rotation shaft 121 and the support arm 122 to rotate about the transmission mechanism 11. An angle between 5 and 90 degrees is formed between the rotation shaft 121 and the fastening shaft 111, preferably between 15 and 45 degrees. A rotation element 124 and an affixation base 125 are connected to two ends of the rotation shaft 121, respectively. The rotation element 124 rotates in response to the transmission element 112, thereby enabling the affixation base 125 to perform inclined rotation movement. The rotation element 124 can be a bevel gear or a crown gear.

The affixation base 125 (as shown in FIG. 3) includes a base plate 1251, a first insertion plate 1252, a second insertion plate 1253 and a ring 1254. The rotation shaft 121 is securely fastened to the center of the base plate 125. The first insertion plate 1252 and the second insertion plate 1253 are disposed above the base plate 125. The ring 1254 the surrounds the exterior edge of the base plate 1251, the first insertion plate 1252, and the second insertion plate 1253. A separation space 1255 is formed between the base plate 1251 and the first insertion plate 1252, and between the first insertion plate 1252 and the second insertion plate 1253. In addition, a plurality of insertion holes 1256, 1256' is formed on the first insertion plate 1252 and the second insertion plate 1253. The insertion holes 1256, 1256' of each insertion plate 1252, 1253 are correspondingly arranged, so as to allow the sample to be securely inserted to the insertion holes 1256, 1256' of the affixation base 125. Furthermore, a plurality of through holes 1257, 1257' is formed on the base plate 1252 and the ring 1254, thereby dissipating heats produced during the coating process and enhancing the coating quality.

The rotation plate assembly 123 includes a circular rotation plate 1231 and a rotation spindle 1232 connected to the bottom portion of the rotation plate 1231. The support arm 122 is securely fastened on the exterior edge of the rotation plate 1231, while the rotation spindle 1232 is connected to a driving device (not shown), e.g. a motor, and electrically connected to a power supply 2.

Samples, such as milling cutters, drills or other tools of different shapes and sizes, are securely inserted to the affixation base 125. The PVD equipment includes an electric arc power supply 3, a sputtering target 4, an ionic device 5, an air inlet 6, and an air evacuation device 7. The electric arc power supply 3 is connected to an electric arc gun 31. The ionic device 5 is an ionic gun. In addition, the air evacuation device 7 is a pump, thereby pumping the PVD chamber to a predetermined vacuum degree. Heating the sample to a temperature according to its material property. In general, the temperature is between 30° C. to 450° C. Ions are generated from the ionic device 5 to clean the sample surface. The nano-meter ions are bombard out from the sputtering target 4 forming a parabolic projectile. After the electric arc process, the nano-meter ions are further refined by the ionic device 5. The affixation base 125 then performs an inclined rotation along the path of the falling projectile of the nano-meter ions. The nano-meter ions are then homogeneously coated on the sample surface. Finally, guiding nitrogen and carbon containing gas into the air inlet 6, and performing a cooling process. This completes the coating process.

Figure 4:
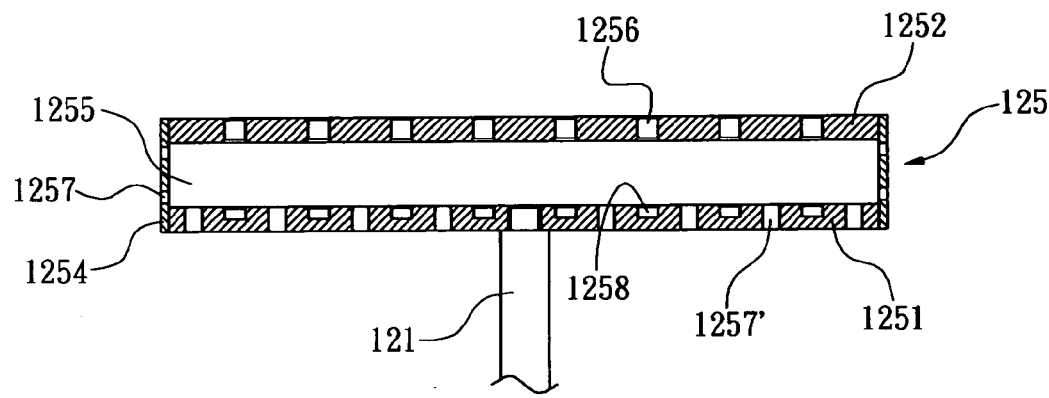
FIG. 4 is a sectional view illustrating the affixation base, in accordance with another embodiment of the present invention.
Figure 5:
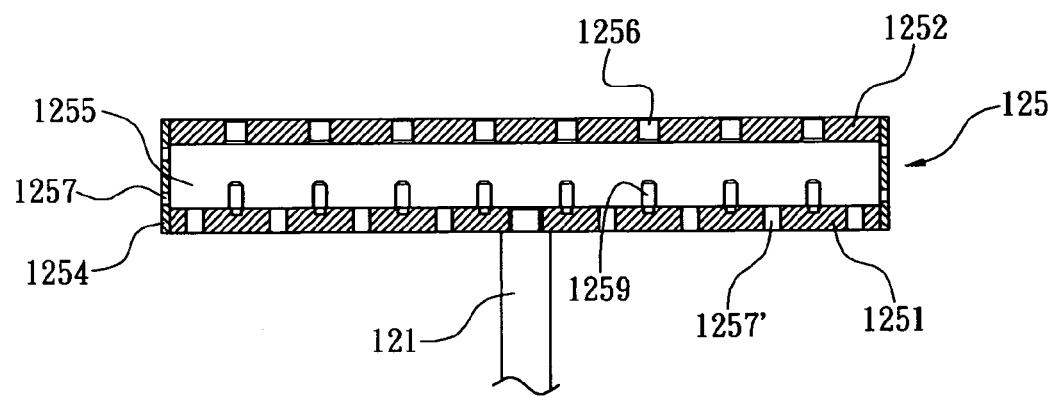
FIG. 5 is a sectional view illustrating the affixation base, in accordance with yet another embodiment of the present invention.

Referring to FIG. 4 and FIG. 5, the sample holder in accordance with another and yet another embodiment of the present invention are illustrated. In addition to what has been described above, the affixation base 125 in this particular embodiment includes a base plate 1251, a first insertion plate 1252 formed above the base plate 1251, and a ring 1254 surrounding the first insertion plate 1252 and the base plate 1251. A separation space 1255 is formed between the base plate 1251, the first insertion plate 1252 and the ring 1254. A plurality of insertion holes 1256 is formed on the first insertion plate 1252. A plurality of through holes 1257' and a plurality of concave grooves 1258 are formed on the base plate 1251. Each concave groove 1258 is formed corresponding to an insertion hole 1256, thereby inserting a sample therein (as shown in FIG. 4). Moreover, a plurality of protrusive pillars 1259 and through holes 1257' can be formed on the base plate 1251. The samples of different shapes and sizes can then be fastened to the affixation base 125 via the protrusive pillars 1259 (as shown in FIG. 5).

Figure 6:
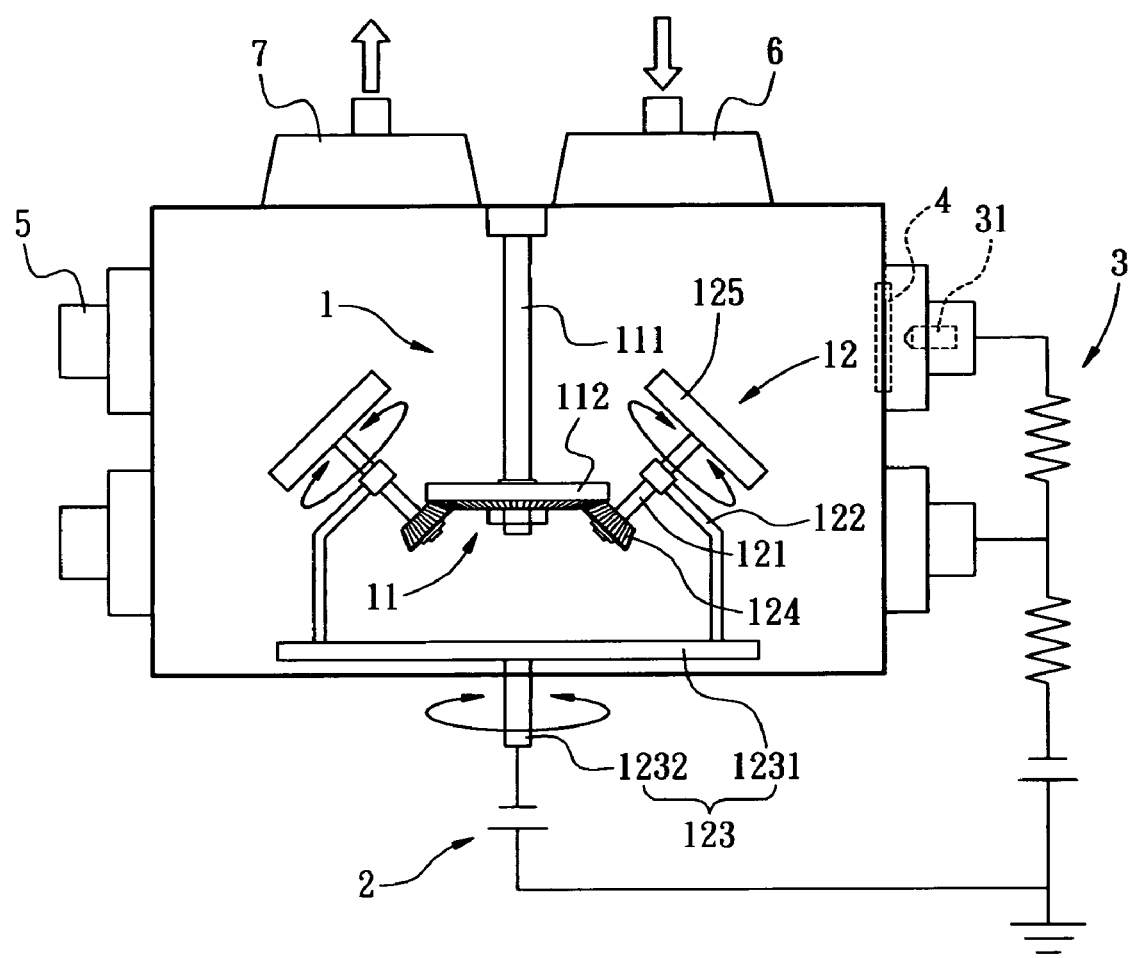
FIG. 6 illustrates a sample holder for physical vapor deposition equipment, in accordance with another embodiment of the present invention.

Referring to FIG. 6, the sample holder in accordance with the second embodiment of the present invention is illustrated. The fastening mechanism 12 of the present invention, can also be formed of a plurality of fastening mechanisms 12. Each fastening mechanism 12 is equally spaced between each other. The fastening mechanism 12 rotates about the transmission mechanism 11. Each of the affixation base 125 also performs rotational motion, thereby balancing the external forces during rotation and increasing production speed.

The sample holder for physical vapor deposition equipment of the present invention not only can improve the drawbacks in the conventional art, but also include the following advantages. Since the affixation base performs an inclined rotation, the nano-meter ions can be received along the projectile path. The sample surface can thus be covered continuously, thereby rendering homogeneous coating thickness and better combination. In addition, the sample holder of the present invention is structurally simple, while the production cost and the maintenance cost are also quite low. Furthermore, the sample holder of the present invention is widely applicable to hold samples of different shapes, structures, and sizes.

In summary, the sample holder for physical vapor deposition equipment of the present invention indeed satisfies the patentability requirements of the patent law, a grant of letters patent therefor is thus respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A sample holder for physical vapor deposition equipment, which is disposed in a vacuum chamber for holding samples, comprising:
    a transmission mechanism comprising a stationary shaft and a transmission element connected to the stationary shaft; and
    at least one fastening mechanism comprising a rotation shaft not parallel with the stationary shaft of the transmission mechanism, a support arm for securely holding the rotation shaft, and a rotational disk assembly that drives the rotation shaft and the support arm to rotate about the transmission mechanism, two ends of the rotation shaft connecting a rotation element and an affixation base for affixing thereto the samples to be coated, wherein the rotation element rotates in response to the transmission element, thereby rendering the affixation base to perform inclined rotation
    wherein the affixation base of the fastening mechanism includes a base plate, a first insertion plate for inserting therein the samples to be coated, the insertion plate disposed above the base plate forming a separation space therebetween, and a ring surrounding the base plate and the first insertion plate.

2. The sample holder as recited in claim 1, wherein the stationary shaft of the transmission mechanism is vertically arranged.

3. The sample holder as recited in claim 1, wherein the angle formed between the stationary shaft of the transmission mechanism and the rotation shaft of the fastening mechanism is between 5 degrees to 90 degrees.

4. The sample holder as recited in claim 1, wherein the angle formed between the stationary shaft of the transmission mechanism and the rotation shaft of the fastening mechanism is preferably between 15 degrees to 45 degrees.

5. The sample holder as recited in claim 1, wherein the transmission element is either a bevel gear or a crown gear.

6. The sample holder as recited in claim 1, wherein a plurality of insertion holes is formed on the first insertion plate, and a plurality of concave grooves is formed on the base plate, the concave grooves corresponding to the insertion holes.

7. The sample holder as recited in claim 1, wherein a plurality of insertion holes is formed on the first insertion plate, and a plurality of protrusive pillars is formed on the base plate, the protrusive pillars corresponding to the insertion holes.

8. The sample holder as recited in claim 1, wherein a plurality of through holes is formed on the base plate and the ring.

9. The sample holder as recited in claim 1, wherein the affixation base further comprises a second insertion plate, the second insertion plate being disposed between the first insertion plate and the base plate forming a separation space between the base plate and the first insertion plate.

10. The sample holder as recited in claim 9, wherein a plurality of insertion holes is formed on the second insertion plate and the first insertion plate, each insertion hole of each insertion plate corresponding with each other.

11. The sample holder as recited in claim 1, wherein the fastening mechanism includes a plurality of sub-fastening mechanisms, each being equally spaced and rotating about the transmission mechanism.

* * * * *